United States Patent
Kim

[11] Patent Number: 6,054,906
[45] Date of Patent: Apr. 25, 2000

[54] RF POWER DIVIDER

[75] Inventor: Wook Kim, Seoul, Rep. of Korea

[73] Assignee: Samsung Electronics Co., Ltd., Rep. of Korea

[21] Appl. No.: 09/040,160

[22] Filed: Mar. 17, 1998

[30] Foreign Application Priority Data

Apr. 26, 1997 [KR] Rep. of Korea ............. 97-15761

[51] Int. Cl.[7] .................................................. H01P 5/12
[52] U.S. Cl. .................................... 333/124; 333/128
[58] Field of Search ................................. 333/124, 128, 333/136

[56] References Cited

U.S. PATENT DOCUMENTS

| | | | |
|---|---|---|---|
| 4,556,856 | 12/1985 | Presser .............................. | 333/124 |
| 4,875,024 | 10/1989 | Roberts ............................. | 333/128 X |
| 5,430,418 | 7/1995 | Blodgett ........................... | 333/124 X |
| 5,469,129 | 11/1995 | Dydyk .............................. | 333/124 |

FOREIGN PATENT DOCUMENTS

| | | |
|---|---|---|
| 2158295 | 11/1985 | United Kingdom . |
| 2204186 | 11/1988 | United Kingdom . |

OTHER PUBLICATIONS

R.C. Webb, Power Divider/Combiners: Small Size, Big Specs, Microwaves, Nov. 1981, pp. 67–74 333–128.

*Primary Examiner*—Paul Gensler
*Attorney, Agent, or Firm*—Dilworth & Barrese

[57] ABSTRACT

An RF power divider is provided for use in a UHF-band high-power amplifier of a radio transmitter. The RF power divider includes: a single input port; first and second output ports; a first microstrip line coupled to the input port; first and second coils coupled in parallel to an output side of the first microstrip line; a second microstrip line coupled between an output side of the first coil and the first output port; a third microstrip line coupled between an output side of the second coil and the second output port; a first capacitor coupled between a ground and a contact point of the first microstrip line and the first and second coils; a resistor coupled between a contact point of the first coil and the second microstrip line, and a contact point of the second coil and the third microstrip line; and a second capacitor coupled in parallel to the resistor. Accordingly, the present invention provides a Wilkinson power divider implemented in a concentrated integer equivalent circuit, in which $\lambda/4$ lines are formed by the coils and the capacitors being lumped elements instead of microstrip lines.

6 Claims, 9 Drawing Sheets

RF POWER DIVIDER

BACKGROUND OF THE INVENTION

1. Field of the Invention

The present invention relates to RF (Radio Frequency) power dividers and, more particularly, to a Wilkinson power divider used in a UHF (Ultra High Frequency) band high-power amplifier of a radio transmitter.

2. Description of the Related Art

As various radio paging services are provided, repair and management have emerged as significant issues to service providers. This is especially so since ever increasing radio pager subscribers have resulted in a proportionate increase of the number of radio paging transmitters utilized to transmit a signal via an air path. However, service providers cannot limitlessly increase radio paging equipment, let alone personnel and subsidiary installations.

Thus, since signals in various forms are rapidly transmitted at one time, and radio paging transmitters broadcast signals ever farther, it is desirable that adequate services be provided with present personnel and established radio paging equipment and subsidiary installations, regardless of the increasing number of subscribers. Accordingly, the need for a high-power amplifier that is able to transmit a signal over a wider area is ever pressing.

Meanwhile, most high-power amplifiers obtain a high power output by combining a plurality of amplifying devices in parallel to amplify a radio signal. However, such combinations are not without output limitations. A device for dividing or combining radio signals is called an RF power divider or combiner. RF power dividers are categorized into T-junction power dividers, Wilkinson power dividers, and quadrature hybrid power dividers. They are selectively used in accordance with their characteristics.

These RF power dividers are used in radio transmitters such as the aforementioned radio paging transmitters. Among them, the Wilkinson power divider is widely used in UHF-band radio transmitters and is basically comprised, in terms of transmission lines, as shown in FIG. 1. FIG. 1 illustrates an equal split ratio Wilkinson power divider for dividing an input signal into two equal output signals. Here, the output signals are in phase with, and 3 dB smaller than, the input signal.

The Wilkinson power divider of FIG. 1 is generally implemented with microstrip lines or coaxial lines having corresponding impedances on a substrate, as shown in FIG. 2. The RF power divider of FIG. 2 has a single input port IP1, and first and second output ports OP1 and OP2. A microstrip line 10 is coupled to input port IP1, and two microstrip lines 18 and 12 are serially coupled between an output side of microstrip line 10 and first output port OP1. Two microstrip lines 20 and 14 are serially coupled between the output side of microstrip line 10 and second output port OP2. Assuming that a system impedance is $Z_0$, the respective impedances of the microstrip lines 10, 12, and 14 are $Z_0$, as shown in FIG. 1. The impedances of microstrip lines 18 and 20, which act as quarter wavelength ($\lambda/4$) lines, are $\sqrt{2}Z_0$, respectively. In addition, a parallel resistor 16 is coupled between the contact points of microstrip lines 18 and 12, and of microstrip lines 20 and 14. The resistance of resistor 16 is $2Z_0$, as shown in FIG. 1.

When the $\lambda/4$ lines are implemented with microstrip lines or coaxial lines as described above, the length of the respective divided lines corresponds to a $\lambda/4$ of the frequency band for which power is divided. That is, the length of microstrip lines 18 and 20 is a $\lambda/4$ of the frequency band and thus, becomes very large if the frequency band is a UHF band. For example, a $\lambda/4$ transmission line for 325 MHz is about 23 cm long.

Therefore, when $\lambda/4$ lines are implemented with microstrip lines or coaxial lines, the RF power divider occupies a large portion of a given amplifier area. As a result, spatial constraints are imposed on the remaining amplifier circuits. Further, the $\lambda/4$ transmission line, the length of which is set in accordance with the frequency band used, is useless against external condition changes such as frequency variation. Thus, the RF power divider should be reconstituted under the varied condition in order to obtain the intended electrical properties.

Another issue with respect to RF power dividers is the measuring of a divider's output signal(s). In order to measure an output signal, measurement terminals of a measuring instrument should be directly connected to the input and output ports. Conventionally, the measurement terminals have been directly soldered to the input and output ports.

SUMMARY OF THE INVENTION

Therefore, an object of the present invention is to provide a smaller RF power divider.

Another object of the present invention is to provide an RF power divider having characteristics that are variably adjusted in conformity with external condition changes.

Still another object of the present invention is to provide an RF power divider which facilitates measurement of the divider's output signal(s).

To achieve the above and other objects, an RF power divider is provided for use in a UHF-band high-power amplifier of a radio transmitter. The RF power divider includes: a single input port; first and second output ports; a first microstrip line coupled to the input port; first and second coils coupled in parallel to an output side of the first microstrip line; a second microstrip line coupled between an output side of the first coil and the first output port; a third microstrip line coupled between an output side of the second coil and the second output port; a first capacitor coupled between a ground and a contact point of the first microstrip line and the first and second coils; a resistor coupled between a contact point of the first coil and the second microstrip line, and a contact point of the second coil and the third microstrip line; and a second capacitor coupled in parallel to the resistor. Therefore, a Wilkinson power divider implemented in a concentrated integer equivalent circuit is provided, wherein $\lambda/4$ lines are formed by the coils and the capacitors being lumped elements instead of microstrip lines.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS

Figure 1:
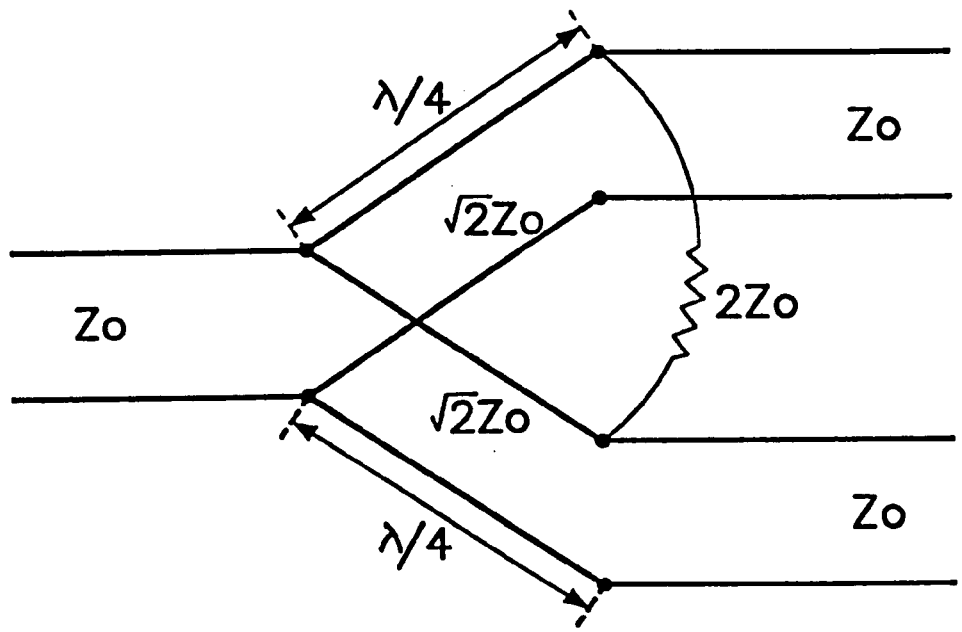
FIG. 1 is a circuit diagram of a general Wilkinson power divider depicted by transmission lines.

An illustrative embodiment of the present invention will be described in detail with reference to the attached drawings. Details such as circuit constitution, types, forms, and numbers of parts, and exemplary values are described in order to provide a comprehensive understanding of the present invention. However, as is known to anyone skilled in the art, the present invention can be implemented without such details. In addition, it should be noted that like reference numerals denote like components in the drawings. Further, well-known functions or constructions which may obscure the invention are not described in detail.

Figures 3A, 3B:
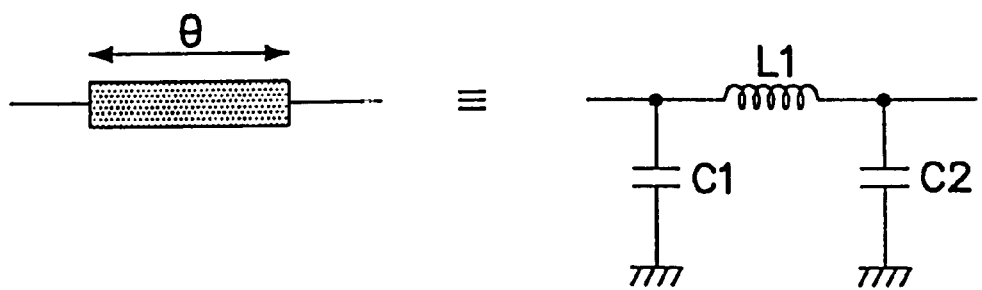
FIGS. 3A and 3B are concentrated integer equivalent circuit diagrams of a microstrip line.

Microstrip lines may be modeled in a concentrated integer equivalent circuit implemented with lumped elements. That is, a single microstrip line as shown in FIG. 3A can be implemented in an equivalent circuit with a single coil L1 and two capacitors C1 and C2 as shown in FIG. 3B. Thus, according to an embodiment of the present invention, the $\lambda/4$ lines in a Wilkinson power divider are composed of lumped elements.

Figure 4:
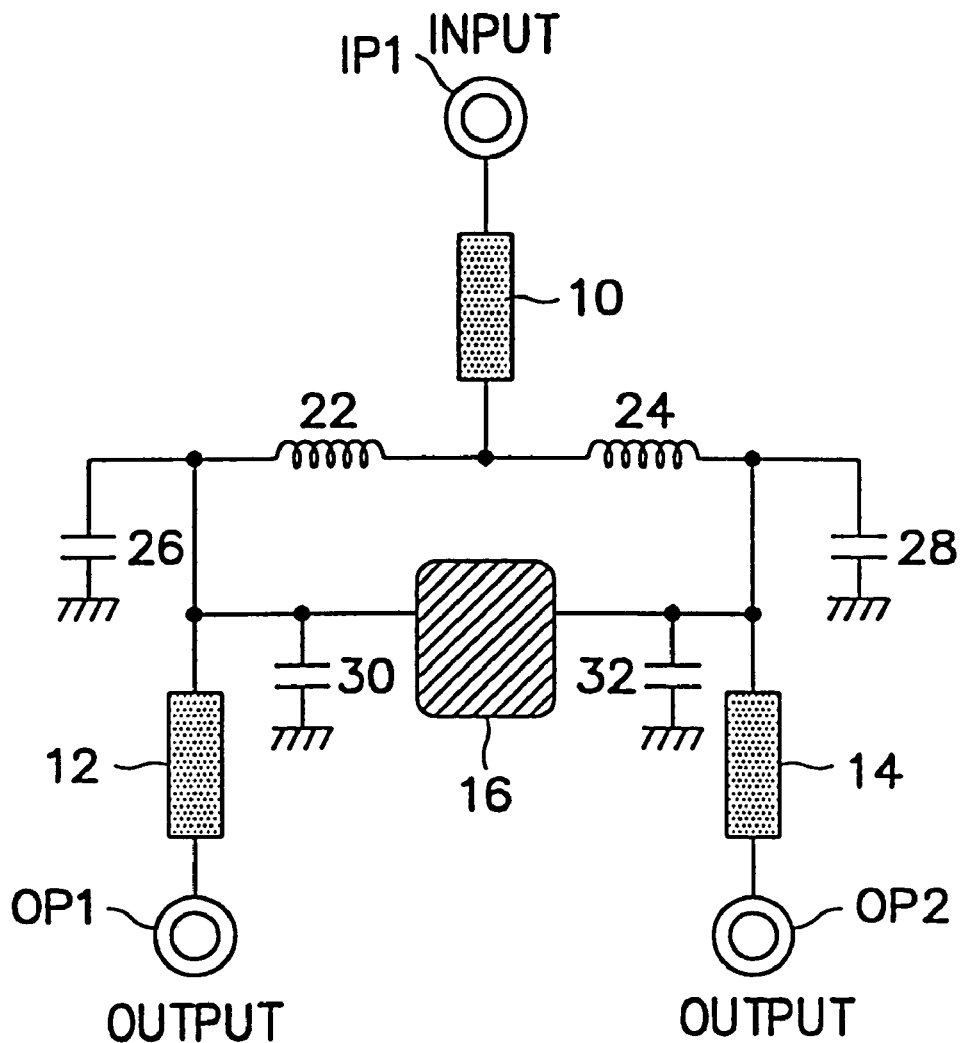
FIG. 4 is a schematic representation of an RF power divider using lumped elements according to an embodiment of the present invention.

FIG. 4 is a schematic representation of an RF power divider using lumped elements according to an embodiment of the present invention. Here, the RF power divider is a Wilkinson power divider which has $\lambda/4$ transmission lines implemented with lumped elements, that is, coils and capacitors. Like reference numerals denote the same components as those of FIG. 2. The RF power divider of FIG. 4 includes single input port IP1, first and second output ports OP1 and OP2, respectively, and microstrip line 10 coupled to input port IP1. A coil 22 and microstrip line 12 are serially coupled between the output side of microstrip line 10 and first output port OP1. A coil 24 and microstrip line 14 are serially coupled between the output side of microstrip line 10 and second output port OP2. Assuming that a system impedance is $Z_0$, the respective impedances of microstrip lines 10, 12, and 14 are $Z_0$, as shown in FIG. 1. The parallel resistor 16 is coupled between the contact points of coil 22 and microstrip line 12, and coil 24 and microstrip line 14. The resistance of resistor 16 is $2Z_0$, as shown in FIG. 1. In addition, a capacitor 26 is coupled between the contact point of coil 22 and microstrip line 12, and a ground. A capacitor 28 is coupled between the contact point of coil 24 and microstrip line 14, and the ground. A capacitor 30 is coupled between the contact point of microstrip line 12 and resistor 16, and the ground. A capacitor 32 is coupled between the contact point of microstrip line 14 and resistor 16, and the ground.

Figure 2:
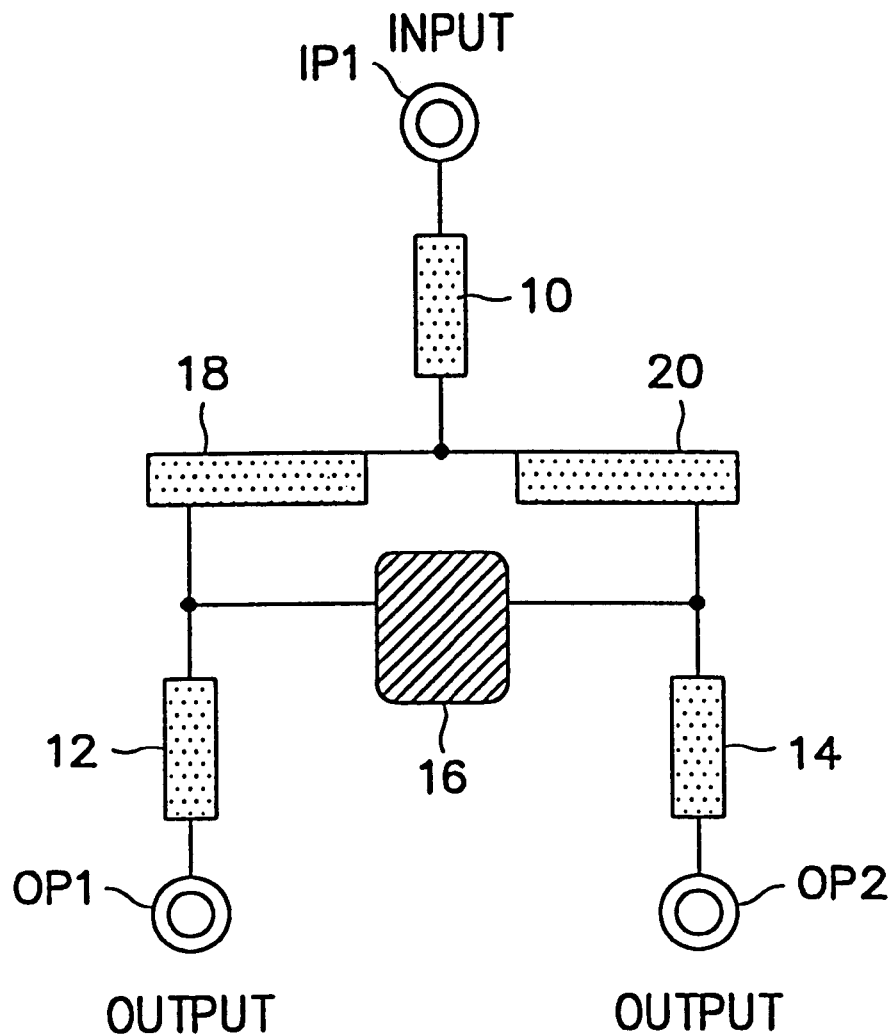
FIG. 2 is a schematic representation of the Wilkinson power divider shown in FIG. 1 implemented with microstrip lines.

The coil 22 and capacitors 26 and 30 in FIG. 4 are a substitute for microstrip line 18 of FIG. 2, and coil 24 and capacitors 28 and 32 are a substitute for microstrip line 20 of FIG. 2. The inductances of coils 22 and 24, and capacitances of capacitors 26, 28, 30, 32 are determined as described hereinbelow in actual application.

It is assumed that a frequency band used in the RF power divider shown in FIG. 4 is 322–328.6 MHz, its central frequency is 325 MHz, and the system impedance $Z_0$ is 50Ω. Referring to FIGS. 3A and 3B, if the microstrip line of FIG. 3A is a $\lambda/4$ transmission line and has an impedance $Z_1$, a reactance X generated by the coil L1 of FIG. 3B, and a reactance B generated by capacitors C1 and C2 of FIG. 3B are given by $$X = Z_1 \sin\theta = \omega L$$

$$B = \frac{1}{Z_1}\tan\frac{\theta}{2} = \omega C \tag{1}$$

where L is an inductance and C is a capacitance. Because $Z_1$ is $\sqrt{2}Z_0$ as shown in FIG. 1, and $\theta$ is 90°, equation (1) can be expressed as $$\sqrt{2}Z_0 \sin 90° = \omega L$$

$$\frac{1}{\sqrt{2}Z_0}\tan\frac{90°}{2} = \omega C \tag{2}$$

Because the central frequency is 325 MHz, equation (2) is developed with respect to the inductance L and the capacitance C, as $$L = \frac{\sqrt{2} \times 50}{2\pi \times 325 \times 10^6} = 34.64 nH$$

$$C = \frac{1}{\sqrt{2} \times 50 \times 2\pi \times 325 \times 10^6} = 6.93 pF \tag{3}$$

Therefore, if the RF power divider of FIG. 4 is used at 325 MHz, coils 22 and 24 have an inductance of 34.63 nH, respectively, and capacitors 26, 28, 30, and 32 have a capacitance of 6.93 pF, respectively.

Figure 5A:
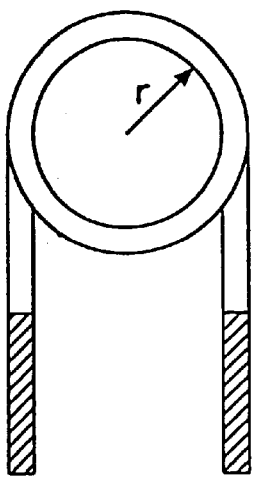
FIGS. 5A and 5B illustrate the side and frontal views, respectively, of the coils shown in FIG. 4.
Figure 5B:
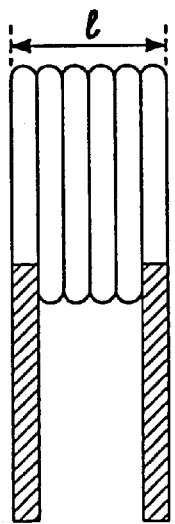

The coils 22 and 24 are air-core coils as shown in FIGS. 5A and 5B. FIGS. 5A and 5B illustrate side and frontal views of coils 22 and 24, respectively. Here, assuming that the radius of coils 22 and 24 is $\gamma$, the winding length is l, and the number of windings is N, the inductance L and the number of windings N are calculated as follows:

$$L = \frac{r^2 N^2}{9r + 10l} \tag{4}$$

$$N = \sqrt{\frac{L(9r + 10l)}{r^2}}$$

Figure 6:
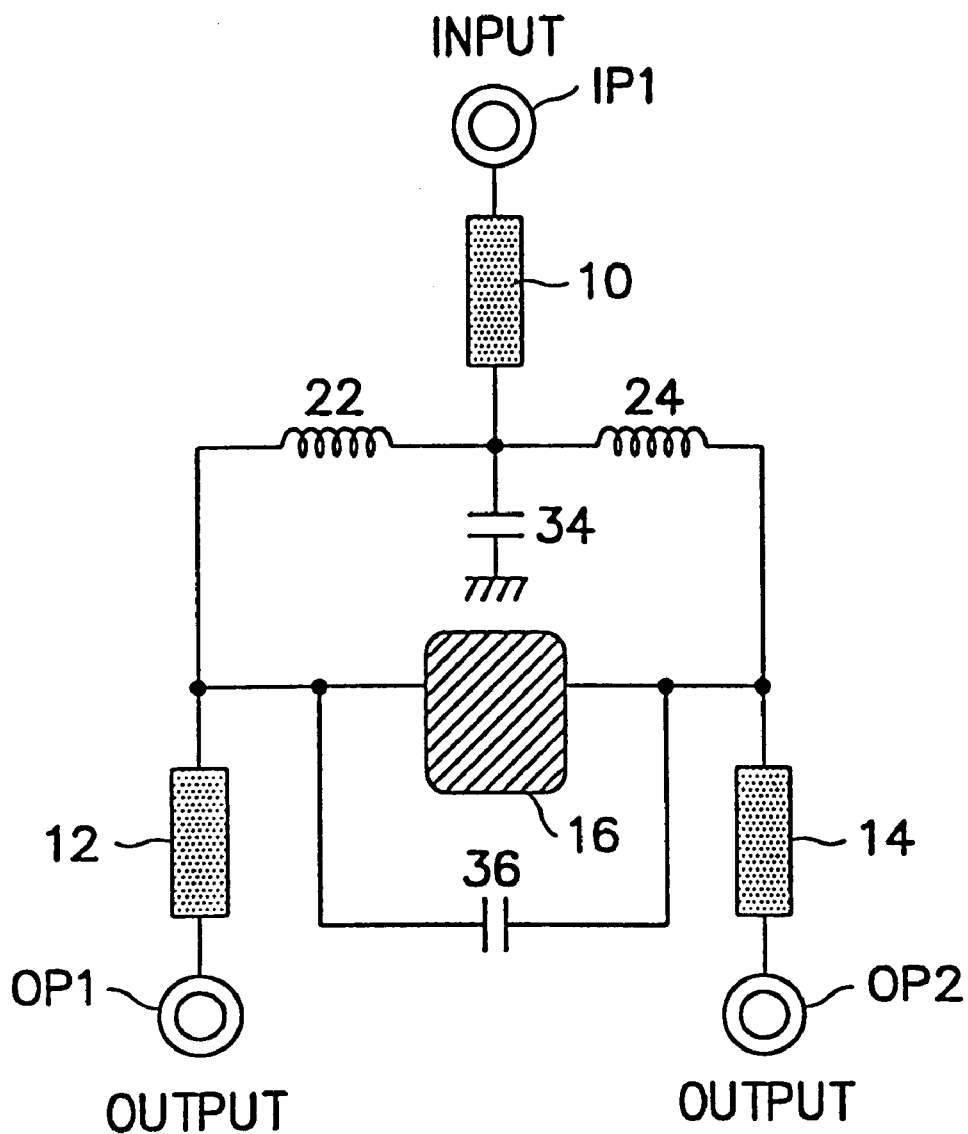
FIG. 6 is a schematic representation of the RF power divider shown in FIG. 4 which has been modified.

Meanwhile, the RF power divider of FIG. 4 can be modified to that of FIG. 6 by combining capacitors 26 and 28 into a single capacitor, and capacitors 30 and 32 into another single capacitor. That is, to emit heat generated during power combination and division to a heat sink through a PCB (Printed Circuit Board), capacitors 26 and 28 are combined into a capacitor 34 having their parallel capacitance 2C on the PCB, whereas capacitors 30 and 32 are combined into a capacitor 36 having their serial capacitance C on the PCB. The capacitor 34 is coupled between the contact point of microstrip line 10 and coils 22 and 24, and the ground. The capacitor 36 is coupled in parallel to resistor 16.

In general, simulation using a simulation tool allows for an overview of the whole device with the least effort before the integration of parts on a PCB. From simulation of the RF power divider shown in FIG. 6 by a Touchstone simulator, measurement results were estimated.

In the simulation, the inductances of air-core coils 22 and 24, and the capacitances of capacitors 34 and 36 were 32.6 nH, 10.42 pF, and 0.747 pF, respectively. On the other hand, the capacitances of capacitors 34 and 36 were 10 pf, and 0.7 pf, respectively, in an application of actual porcelain capacitors. In addition, the inductance of coils 22 and 24 can be obtained by equation (4), and should be adjusted using a network analyzer after the manufacturing process. Hence, coils 22 and 24 are formed by winding a 1.2 mm-diameter enamel line around a 4 mm-diameter forming bar three times, and tuning by a measuring instrument to have an inductance of 32 nH, before they are integrated on the PCB.

An actual PCB pattern was designed by a CAD (Computer Aided Design) tool, that is, a wave maker on the basis of data estimated by the Touchstone simulator. A TEFLON substrate having a dielectric constant $\epsilon_0$ of 2.5, which is widely used in RF circuits, was employed in the RF power divider according to the present invention. Additionally, capacitors 34 and 36 were high-Q porcelain capacitors by ATC (American Technical Ceramic).

Figure 7:
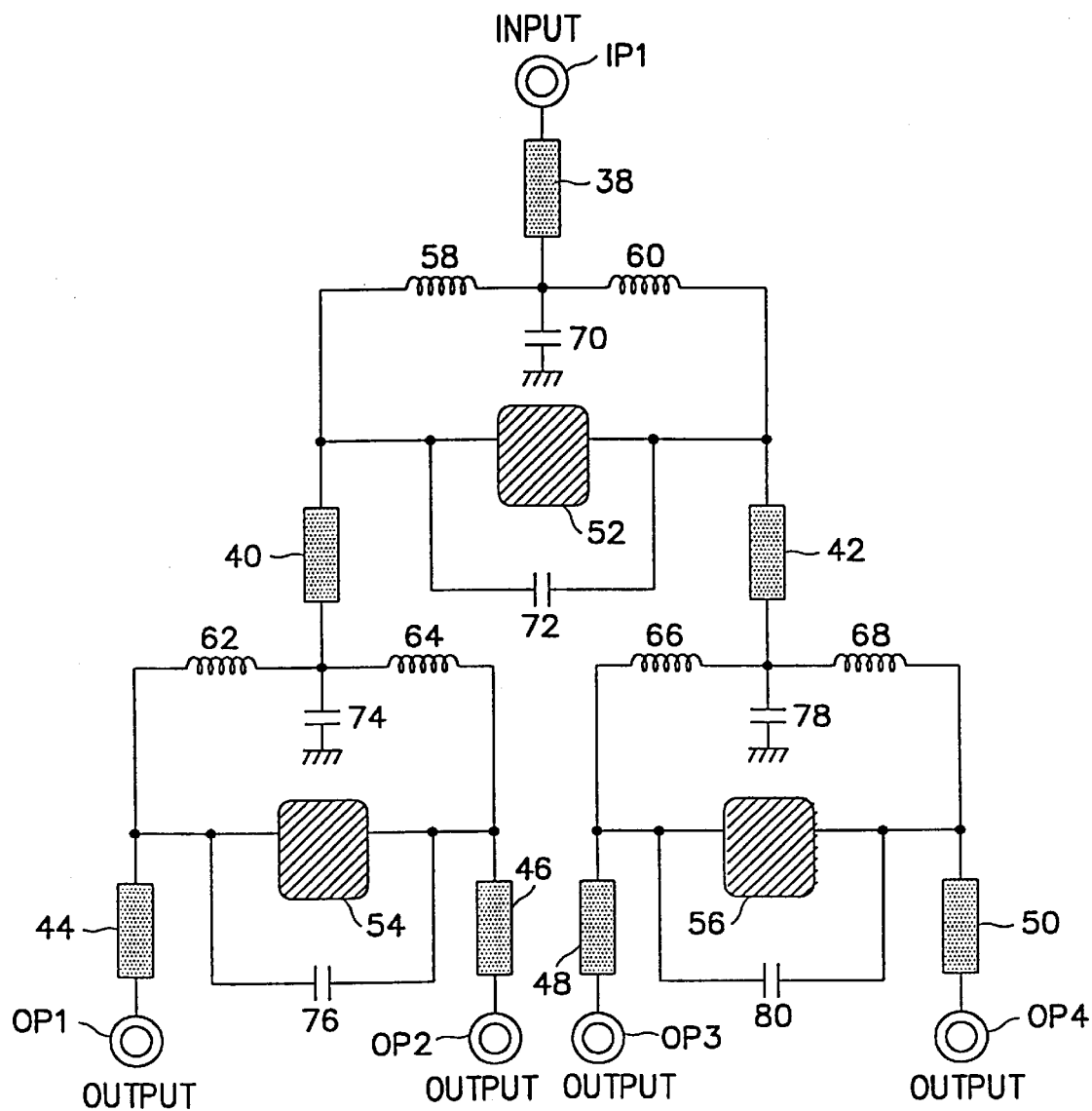
FIG. 7 is a schematic representation of a four-output RF power divider using the RF power divider shown in FIG. 6.

The RF power divider of FIG. 7 can be obtained by connecting multiple RF power dividers as shown in FIG. 6 in order to increase the number of divided signals. FIG. 7 is a schematic representation of a four-output RF power divider, wherein an RF power divider as shown in FIG. 6 is coupled to each of the first and second output ports OP1 and OP2 of another RF power divider of FIG. 6.

Therefore, the four-output RF power divider of FIG. 7 has the single input port IP1 and first to fourth output ports OP1–OP4, respectively. The RF power divider of FIG. 7 can be considered as being comprised of three RF power dividers as shown in FIG. 6, wherein an element of one divider may also comprise a similar element in another divider. The three groups are as follows: microstrip lines 38, 40, and 42, a resistor 52, coils 58 and 60, and capacitors 70 and 72; microstrip lines 40, 44, and 46, a resistor 54, coils 62 and 64, and capacitors 74 and 76; and microstrip lines 42, 48, and 50, a resistor 56, coils 66 and 68, and capacitors 78 and 80. Here, the microstrip lines 40 and 42 are commonly used.

In FIG. 7, a signal input provided to the input port IP1 is divided into four signals, which are attenuated by 6dB from the input signal, have the same phase as the input signal, and are outputted to first to fourth output ports OP1–OP4. Here, signal attenuation in a corresponding frequency band, and isolation degrees among the output ports are determined by adjusting intervals of coils 58–68. That is, because the RF power divider is influenced by external conditions such as frequency variation, its electrical characteristics can be compensated for by adjusting the intervals of coils 58–68. Therefore, coils 58–68 serve as variable adjustment points so that the RF power divider may flexibly conform to external condition variations. After the RF power divider is adjusted in the corresponding frequency band, the four divided signals, which are attenuated by 6 dB from the original signal and have the same phase as the original signal, become input signals of high-power amplifiers in the next stage.

Figure 8:
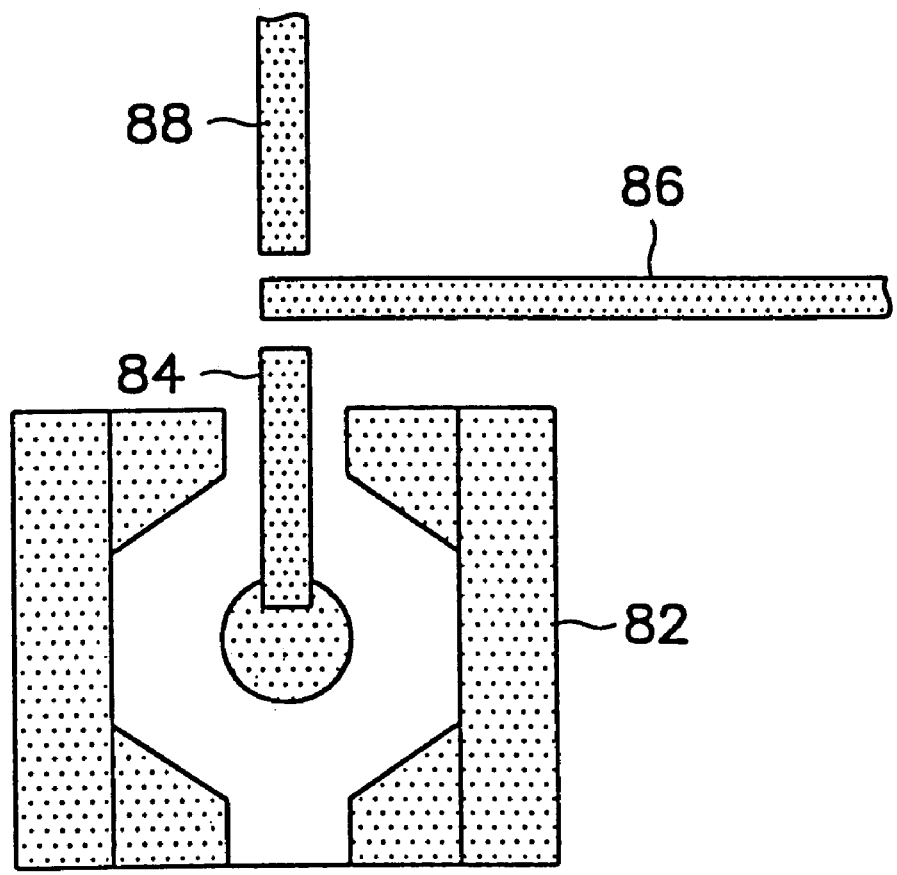
FIG. 8 illustrates patterns of a measuring connector according to an embodiment of the present invention.

Meanwhile, measuring connectors are integrated on the PCB to connect measurement terminals of a measuring instrument to the following locations of the RF power dividers of FIGS. 6 and 7, respectively: input port IP1 and first and second output ports OP1 and OP2; and input port IP1, first to fourth output ports OP1–OP4, and output terminals of microstrip lines 40 and 42. FIG. 8 is a magnified view of the patterns of such a measuring connector. Measuring connector patterns or leads 82 and 84 are used to insert a measurement terminal of the measuring instrument. Lines 86 and 88 are an output line of an RF power divider in the previous stage, and an input line of an RF power divider in the next stage, respectively. Therefore, the paths of signals can be determined by inserting a measurement terminal into the measuring connector to be connected to measuring connector patterns 82 and 84, and positioning a porcelain capacitor between pattern 84 and line 86, or between lines 86 and 88. That is, a signal is attenuated by 3 dB through the measuring connector by positioning the porcelain capacitor between pattern 84 and line 86, while the porcelain capacitor positioned between lines 86 and 88 is connected as an input path of the power divider in the next stage. As a result, signals outputted from the output ports can be measured without soldering the measurement terminals to the input and output ports.

Figure 9:
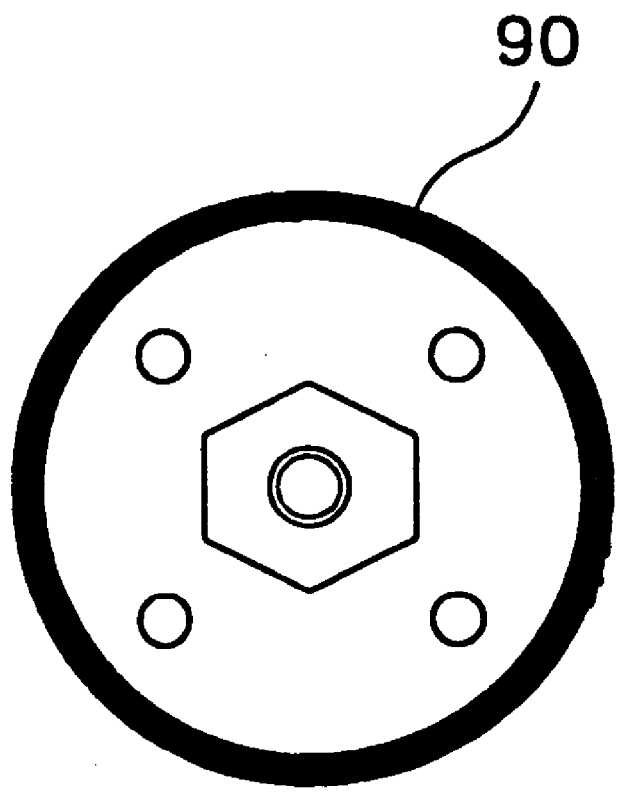
FIG. 9 is a view of a silk marking on the rear surface of the measuring connector shown in FIG. 8.

When the measuring connector is soldered to the PCB, the surface of the PCB around the connector may become uneven due to lead dropped on the soldered surface. Accordingly, the uneven surface may impede tight contact between the heat sink of a high-power amplifier and the substrate so that RF ground effect cannot be obtained. To prevent this, silk 90 is placed on the soldered rear surface of the PCB having the measuring connector patterns 82 and 84. The silk 90, placed in a circle in FIG. 9, prevents the introduction of lead onto the soldered surface while the measuring connector is being soldered to the PCB. In actual fabrication of the RF power divider, the silk 90 was placed in a circle having a diameter of 12 mm and a line thickness of 1 mm. Thus, the substrate around the connector tightly contacts with the heat sink of the high-power amplifier.

A signal is attenuated by 20 dB or more in the corresponding frequency's second- and third-order bands in view of the electrical characteristics of the present invention. Therefore, wave quality can be increased by suppressing the second and third order harmonic frequencies of a radio signal.

As described above, the RF power divider of the present invention advantageously enables efficient use of amplifier space by implementing $\lambda/4$ lines with lumped elements and thus significantly reduces the length of the $\lambda/4$ lines. Furthermore, electrical characteristics of the RF power divider may be variably adjusted in conformity with external condition changes without restructuring the RF power divider, and output signals thereof are easily measured by providing a measuring connector on a substrate.

As will be readily appreciated by those skilled in the art, while the present invention has been described in detail with reference to illustrative embodiments, many variations can be made within the scope and spirit of the present invention. A central frequency of 325 MHz, to which the present invention is applied in an above embodiment, may be replaced with any frequency in the UHF band. Thus, the appropriate scope hereof is deemed to be in accordance with the claims as set forth below.

What is claimed is:

1. An RF power divider for use in a UHF-band high-power amplifier of a radio transmitter implemented in an integer equivalent circuit wherein quarter wavelength lines are formed by lumped elements to provide a smaller RF power divider, said lumped elements including a first and second capacitor, said RF power divider comprising:

a single input port;

first and second output ports;

a first microstrip line coupled to the input port;

first and second coils coupled in parallel to an output side of the first microstrip line;

a second microstrip line coupled between an output side of the first coil and the first output port;

a third microstrip line coupled between an output side of the second coil and the second output port;

said first capacitor coupled between a ground and a contact point of the first microstrip line and the first and second coils;

a resistor coupled between a contact point of the first coil and the second microstrip line, and a contact point of the second coil and the third microstrip line;

said second capacitor coupled in parallel with the resistor and being in parallel with only the resistor and said first coil and first and second capacitors, and said second coil and first and second capacitors respectively forming lumped element equivalents of a quarter wavelength line.

2. The RF power divider of claim 1, wherein the RF power divider is coupled to each of the first and second output ports.

3. The RF power divider of claim 2, wherein the first and second coils are air-core coils.

4. The RF power divider of claim 1, wherein the first and second coils are air-core coils.

5. The RF power divider of claim 4, wherein the first and second coils are variable adjustment points with respect to external condition changes.

6. The RF power divider of claim 1, further comprising:

third, fourth, fifth, and sixth output ports;

third and fourth coils coupled in parallel to the first output port;

a fourth microstrip line coupled between an output side of the third coil and the third output port;

a fifth microstrip line coupled between an output side of the fourth coil and the fourth output port;

a third capacitor coupled between a ground and a contact point of the second microstrip line and the third and fourth coils;

a second resistor coupled between a contact point of the third coil and the fourth microstrip line, and a contact point of the fourth coil and the fifth microstrip line;

a fourth capacitor coupled in parallel to the second resistor;

fifth and sixth coils coupled in parallel to the second output port;

a sixth microstrip line coupled between an output side of the fifth coil and the fifth output port;

a seventh microstrip line coupled between an output side of the sixth coil and the sixth output port;

a fifth capacitor coupled between a ground and a contact point of the third microstrip line and the fifth and sixth coils;

a third resistor coupled between a contact point of the fifth coil and the sixth microstrip line, and a contact point of the sixth coil and the seventh microstrip line; and a sixth capacitor coupled in parallel to the third resistor.

* * * * *